(12) United States Patent
Fagg

(10) Patent No.: US 8,854,139 B2
(45) Date of Patent: Oct. 7, 2014

(54) REGULATED CASCODE CURRENT MIRROR SCHEME FOR TRANSCONDUCTANCE AMPLIFIERS

(75) Inventor: Russell Fagg, Cambridge (GB)

(73) Assignee: Nujira Limited, Cambridge (GB)

(*) Notice: Subject to any disclaimer, the term of this patent is extended or adjusted under 35 U.S.C. 154(b) by 0 days.

(21) Appl. No.: 13/483,161

(22) Filed: May 30, 2012

(65) Prior Publication Data

US 2013/0321081 A1    Dec. 5, 2013

(51) Int. Cl.
*H03F 3/04*      (2006.01)

(52) U.S. Cl.
USPC .......................................................... 330/288

(58) Field of Classification Search
USPC ............................ 330/288, 311; 323/315–316
See application file for complete search history.

(56) References Cited

U.S. PATENT DOCUMENTS

| | | | |
|---|---|---|---|
| 6,268,772 B1 * | 7/2001 | Chen | 330/288 |
| 6,714,081 B1 * | 3/2004 | Xu | 330/296 |

* cited by examiner

*Primary Examiner* — Hieu Nguyen
(74) *Attorney, Agent, or Firm* — Mendelsohn, Drucker & Dunleavy, P.C.; Steve Mendelsohn

(57) ABSTRACT

There is described an amplification stage comprising: a current mirror circuit comprising a reference transistor arranged to receive a current associated with an input signal and an output transistor providing a current source for an output signal line; a current sink to the output signal line, under the control of the input signal; circuitry arranged to maintain equality between the drain/collector voltages on the transistors of the current mirror circuit.

18 Claims, 3 Drawing Sheets

REGULATED CASCODE CURRENT MIRROR SCHEME FOR TRANSCONDUCTANCE AMPLIFIERS

BACKGROUND OF THE INVENTION

1. Field of the Invention

The present invention relates to amplifiers including a current mirror arrangement. The invention is particularly but not exclusively concerned with transconductance amplifiers in envelope tracking architectures.

2. Description of the Related Art

Frequency domain duplex (FDD) systems include transceivers that have a transmitter and a receiver which operate at different carrier frequencies. A simple exemplary architecture of such an FDD system is illustrated in FIG. 1. A transceiver includes a transmitter 6 which receives an input signal on line 2 to be transmitted by an antenna 18. A receiver 8 receives signals that are detected at the antenna and delivers them on signal line 4. The output of the transmitter 6 is delivered to a duplex filter 14 on line 10. A received signal detected at the antenna 18 is delivered from the duplex filter 14 on a line 12 to the receiver 8. The antenna 18 is connected to the duplex filter 14 via line 16.

In such an FDD system it is essential that energy from the transmitter does not block the receiver. This may occur because the duplex filter on the output of the transmitter has only limited attenuation. Any noise present at the receiver frequency on the transmitter output due to noise from the transmitter has the potential to cause receiver blocking.

The transmitter circuitry 6 typically includes a transconductance amplifier. A transconductance amplifier generates a current which is proportional to its input voltage. Any noise present at the receiver frequency on the transmitter output due to noise from a transconductance amplifier in the transmitter has the potential to cause the above-mentioned receiver blocking. This noise must therefore preferably not be allowed to exceed a low level while the power consumption of the transconductance amplifier is minimised. Thus efficient, low noise, high linearity transconductance amplifiers are required in FDD systems.

A typical transconductance amplifier has a high output impedance that sinks and/or sources current into a load that has as an input a very low impedance virtual earth. Such an arrangement is very efficient at ensuring a majority of the transconductance amplifiers current is fed into the load with minimal loss in the transconductance amplifier's output impedance.

However, a low impedance load reduces the power supply rejection ratio (PSRR) of transconductance amplifiers designed to operate from low voltage supply rails and requiring a large output dynamic range and low noise.

It is an aim of the invention to address one or more of the above-stated problems with an improved amplifier arrangement, such as an improved transconductance amplifier arrangement.

SUMMARY OF THE INVENTION

The invention provides a regulated cascode current mirror scheme suitable for transconductance amplifiers, to allow the use of a cascode transistor and a balance capacitor in the transconductance amplifier's output in order to boost the rejection of switch mode power supply borne interference.

In order to implement such a solution extra circuitry is required to implement the regulated cascode current mirror scheme. This increases both the die area and design and verification time. However the invention provides significant benefits.

In an embodiment there is provided an amplification stage comprising: a current mirror circuit comprising a reference transistor arranged to receive a current associated with an input signal and an output transistor providing a current source for an output signal line; a current sink to the output signal line, under the control of the input signal; circuitry arranged to maintain equality between the drain/collector voltages on the transistors of the current mirror circuit.

The circuitry may be arranged to maintain equality between the drain/collector voltages on the transistors of the current mirror circuit includes an additional transistor having a conductive path connected between the current source and the output signal line, and being controlled by a difference between the drain/collector voltages.

The amplification stage may further comprise a difference amplifier having inputs arranged to the drain/collector voltages of the current mirror circuit transistors, and an output connected to the control node of the additional transistor.

The circuitry may be arranged to maintain equality between the drain/collector voltages on the transistors of the current mirror circuit includes an additional transistor having a conductive path connected between a supply voltage and the current source, and being controlled by a difference between the drain/collector voltages. The amplification stage may further comprise a difference amplifier having inputs arranged to the drain/collector voltages of the current mirror circuit transistors, and an output connected to the control node of the additional transistor.

The input signal is preferably a voltage signal. The amplification stage preferably further comprises a first input transistor arranged to receive the input signal voltage at a control node thereof and for providing the current associated with the input signal. The amplification stage may further comprise a second input transistor arranged to receive the input signal voltage at a control node thereof, and providing the current sink to the output.

The amplification stage may further comprise a capacitor having one terminal connected to the drain/collector of the output transistor of the current mirror and one terminal connected to the first supply voltage.

A transconductance amplifier may includeg an amplification stage. An envelope tracking power supply for a radio frequency power amplifier may include an amplification stage. A handset of a mobile communication system may include an amplification stage.

An infrastructure element of a mobile communication system may include an amplification stage.

In an embodiment there is provided an amplification stage comprising: a current mirror circuit comprising a reference transistor arranged to receive a reference current and an output transistor providing a current source for an output signal line; a first input transistor arranged to receive an input signal, and provide the reference current to the reference transistor of the current mirror; a second input transistor arranged to receive the input signal, and provide a current sink for the output signal line; an difference amplifier arranged to amplify the difference between the drain/collector voltages of the reference and output transistors of the current mirror; and an additional transistor connected in the current source path between a supply voltage and the output signal line, and arranged to receive the output of the difference amplifier at its control node, for maintaining equality between the drain/collector voltages on the transistors of the current mirror circuit.

The additional transistor may be connected between the supply voltage and source/emitter of the output transistor of the current mirror.

The additional transistor may be connected between the drain/collector of the output transistor of the current mirror and the output signal line. The amplification stage may further comprise a capacitor having one terminal connected to the drain/collector of the output transistor of the current mirror and one terminal connected to the first supply voltage. The amplification stage may further comprise an input stage for providing the input signal.

An envelope tracking power supply for an RF amplifier may include a transconductance amplifier having an amplification stage. A mobile communication system may include an amplification stage.

BRIEF DESCRIPTION OF THE FIGURES

The invention is now described by way of example with reference to the accompanying figures, in which.

DESCRIPTION OF THE PREFERRED EMBODIMENTS

The invention is now described by way of example with reference to particular embodiments and exemplary implementations. The invention is not limited to the details of any described embodiment or exemplary implementations.

Figure 1:
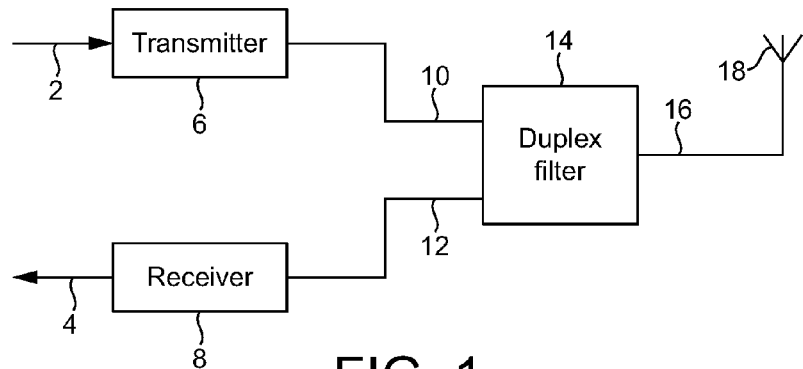
FIG. 1 illustrates an FDD transceiver, in which embodiments of the invention may be implemented.
Figure 2:
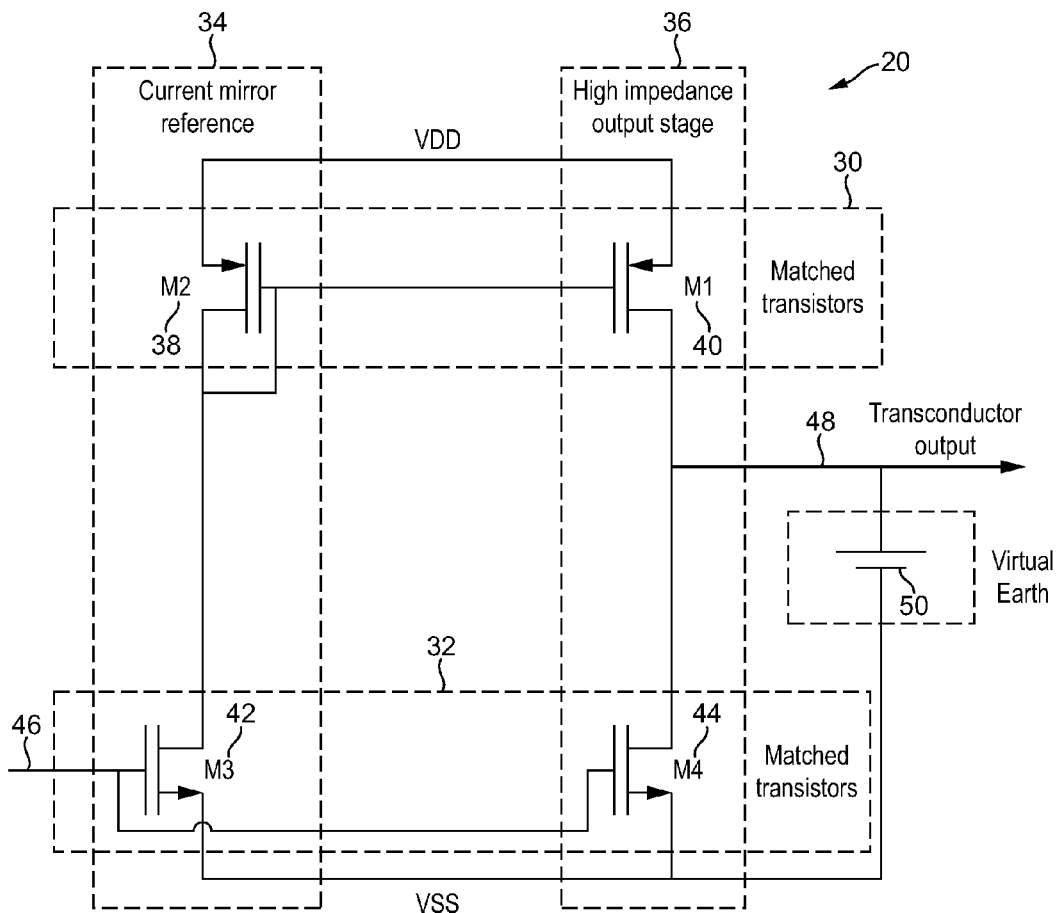
FIG. 2 illustrates a prior art transconductance amplifier arrangement.

With reference to FIG. 2 there is illustrated an exemplary arrangement of a transconductance amplifier as known in the art.

As illustrated in FIG. 2, part of a transconductance amplifier generally designated by reference numeral 20 includes a first pair 30 of matched transistors 38 and 40, respectively designated as M2 and M1. The transconductance amplifier 20 further comprises a second pair 32 of matched transistors 42 and 44, respectively designated as M3 and M4.

The pair 30 of transistors 38 and 40 constitute a current mirror, with the transistor 38 forming the reference transistor of the current mirror and the transistor 40 forming the output transistor of the current mirror.

The pair of transistors 42 and 44 each receive at a control node thereof an input signal to be amplified on line 46. The input signal on line 46 is provided from an input stage of the transconductance amplifier (not shown).

In the exemplary arrangement of FIG. 2 the transistors are MOS transistors, and a control node of the transistors comprises a gate terminal. The invention is not limited to MOS transistors, however, and may be implemented with bipolar transistors in alternative embodiments.

Each of the transistors 42 and 44 has a first source/drain terminal connected to a first power supply voltage level denoted as $V_{SS}$.

The other source/drain terminal of the transistor 42 is connected to one of the source/drain terminals of the transistor 38 of the current mirror circuit. The other of the source/drain terminals of the transistor 44 is connected to one of the source/drain terminals of the output transistor 40 of the current mirror circuit. The other of the source/drain terminals of the current mirror transistors 38 and 40 are connected to a second supply voltage, denoted as $V_{DD}$.

A transconductance amplifier output is provided on line 48, which is derived from the line connecting the source/drain terminals of the transistors 40 and 44.

A battery 50 is illustrated as connected between the output line 48 and the first supply voltage $V_{SS}$, and represents a model of the input that a following stage (not shown) typically presents to the output of the transconductance amplifier.

The first supply voltage $V_{SS}$ represents a low voltage supply rail, and the supply voltage $V_{DD}$ represents a high voltage supply rail.

The portion of the transconductance amplifier shown in FIG. 2 comprises an output stage 36 including the transistors 40 and 44, and a reference current mirror stage comprising transistors 38 and 40.

The transistors 40 and 44 operate to provide the output signal on line 48 under the control of the input signal. Each transistor 40 and 44 provides one half of the output signal.

Because the input signal is a single signal, the transistors 42 and 38 are used to generate a voltage at the gate of transistor 40, the gate of transistor 44 receiving the input signal directly. The transistor 38 transfers the input signal on line 46 to the gate of transistor 40.

The transconductance amplifier 20 of FIG. 2 has an infinite power supply rejection ratio (PSRR) if transistors 38 and 40 are perfectly matched. However in practice there are load mismatches presented to the transistors 38 and 40 by the transistors 42 and 44, which means that the power supply rejection ratio is in fact limited.

For the transistor 38, a load mismatch arises as the drain of the transistor 38 is loaded by the high impedance drain of transistor 42. For the transistor 40 a load mismatch arises as the transistor 40 is connected to a virtual earth of the transconductance amplifier's load, which ideally is very close to zero Ohms.

At high frequencies, the difference in capacitive loading of the transistors 38 and 40 limits the high frequency power supply rejection ratio. The capacitive load for transistor 38 includes the gate capacitance of transistor 38 itself, the gate capacitance of transistor 40, and the drain capacitance of transistor 42. However for the match transistor 40, the impedance at all frequencies is dominated by the virtual earth load, which ideally has zero capacitance.

Figure 3:
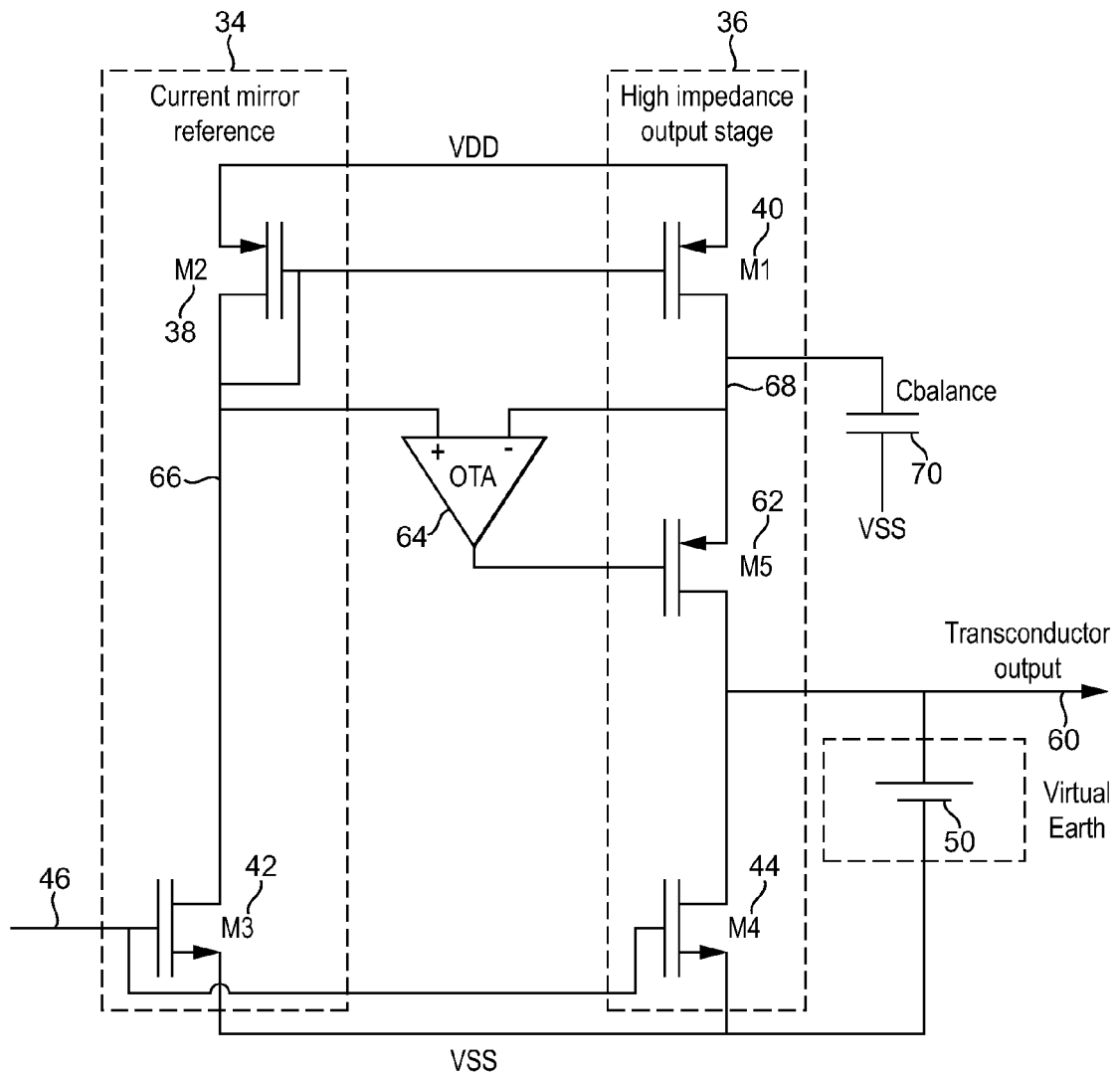
FIG. 3 illustrates a transconductance amplifier arrangement modified in accordance with a preferred embodiment of the invention.

With reference to FIG. 3 there is illustrated an improved transconductance amplifier output stage in accordance with a preferred embodiment of the invention. Where elements of FIG. 3 correspond to elements of FIG. 2 like reference numerals are utilised.

In the arrangement of FIG. 3 the arrangement of FIG. 2 is modified by the inclusion of additional cascode transistor 62. The source of transistor 62 is connected to the drain of transistor 40, and the drain of transistor 62 is connected to the drain of transistor 44. The transconductance amplifier output is provided on line 60, at the connection between the drains of the transistors 62 and 44.

The battery 50 is again illustrated as connected from the transconductance amplifier output line 60 to the first supply voltage $V_{SS}$.

As additionally illustrated in FIG. 3, an operational transconductance amplifier 64 is provided having an output connected to the control node (gate) of transistor 62, and having two inputs connected respectively to the drain terminals of the transistors 38 and 40. The non-inverting input of the amplifier 64 is connected to the drain of transistor 38 and the inverting input of the amplifier is connected to the drain of transistor 40. The drain terminals of the transistors 38 and 40 are respectively connected to lines 66 and 68. The operational transconductance amplifier is a voltage controlled current source, the differential input voltage of which produces an output current.

As also illustrated in FIG. 3 the circuit optionally includes a balance capacitor 70, connected between the drain of transistor 40 and the first supply voltage $V_{SS}$.

In general, the amplifier 64 and the transistor 62 comprise an example implementation of circuitry arranged to maintain equality between the drain voltages on the transistors of the current mirror circuit, i.e. the voltages on lines 66 and 68.

The operational transconductance amplifier 64 and additional (or cascode) transistor 62 isolate the drain of transistor 40 from the low impedance virtual earth provided at the transconductance output line 60. This removes the impedance imbalance present in the arrangement of FIG. 2.

The operational transconductance amplifier 64 additionally equalises the drain voltages of the transistors 38 and 40, such that their output conductances can be made to track very closely, any difference being limited by the DC gain of the operational transconductance amplifier 64. The amplifier 64 is a difference amplifier which amplifies the difference of the drain voltages of transistors 38 and 40 to control the gate of the additional transistor 62, to equalise the drain voltages.

In an alternative arrangement to that shown in FIG. 3, the transistor 62 may be connected between the supply voltage $V_{DD}$ and the source of the transistor 40. The transistor 62 may still be controlled by the amplifier 64 based on the drain voltages. This provides an alternative embodiment for maintaining equality between the drain voltages on the transistors of the current mirror circuit.

Referring again to FIG. 3, if the output conductance of transistor 62 is matched to the conductance of the transistor 42, then the combined conductances of transistor pairs 38, 42 and 40, 62 are matched, providing excellent low frequency power supply rejection ratio.

At high frequencies, the power supply rejection ratio is limited by the capacitance balance of transistor pairs 38, 42 and 40, 62. The capacitive load for transistor 38 includes the gate capacitance of transistor 38 itself, the gate capacitance of transistor 40, and the drain capacitance of transistor 42. In the arrangement of FIG. 3, the balance capacitor 70 is preferably provided and can be adjusted so that the total capacitance of the drain of transistor 40 equals the total capacitance at the drain of transistor 38, which provides excellent high frequency power supply rejection ratio.

The transistor 42 is provided to generate a current for the transistor 38 in dependence on the input voltage on line 46. In general, the transistor 42 injects a current to the drain of transistor 38 in dependence on the input voltage, and is therefore a current injection means. In a similar way, a current based on the input voltage could be injected to the drain of transistor 62, and the transistor 44 is an implementation of a current injection means.

The arrangement of FIG. 3 reflects an arrangement in which the input signal is a voltage. In an alternative arrangement the input signal may be a current. With an input current, the transistors 42 and 44 may not be necessary, and they may be each replaced by an appropriate current injection means.

The described embodiments show a FET implementation. The invention may be implemented as a bipolar arrangement, with circuitry arranged to maintain equality between the collector voltages of bipolar transistors in a current mirror circuit.

Figure 4:
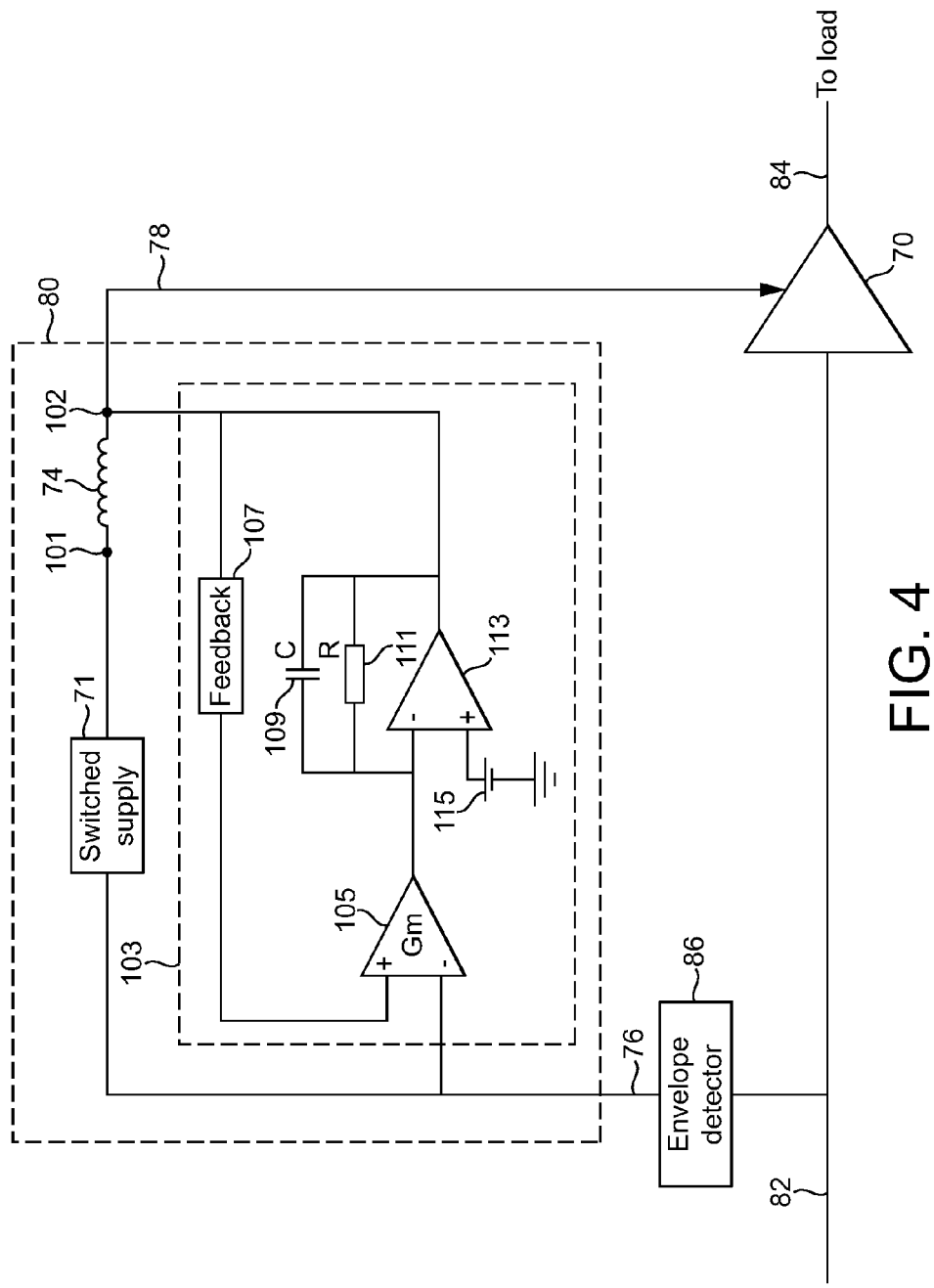
FIG. 4 illustrates an exemplary application of a transconductance amplifier in accordance with the invention.

With reference to FIG. 4, there is illustrated an example implementation of a transconductance amplifier such as transconductance amplifier 30 of FIGS. 3 and 4, in which the modifications according to the present invention may be implemented.

FIG. 4 illustrates an RF power amplifier 70 with an envelope tracking modulated power supply 80. An RF input signal on line 82 is amplified by the RF amplifier 70 to provide an amplified RF output signal on line 84, which is delivered to a load such as an RF antenna.

An envelope detector 86 additionally receives the RF input signal on line 82 and generates an envelope signal on line 76 representing the envelope of the input signal to be amplified. This forms the input to the envelope tracking power supply 80.

One of a plurality of available voltage levels is selected in a switched supply circuit 71 in dependence upon the envelope signal on line 76, and the selected switched supply voltage is connected to a first terminal 101 of an inductor 74.

A correction amplifier arrangement generally designated by reference numeral 103 additionally receives the envelope signal on line 76. The correction amplifier arrangement comprises, in the illustrative arrangement, a transconductance amplifier 105, an amplifier 113, a resistor 111, a capacitor 109, a battery 115 and a feedback stage 107. The correction amplifier arrangement 103 is merely illustrative of an exemplary implementation, and one skilled in the art will appreciate that alternative implementation are possible to provide a correction to the voltage generated by the switched supply 71.

With reference to the correction amplifier arrangement 103, the transconductance amplifier 105 receives the envelope signal on line 76 at its inverting input, and receives an output supply voltage on line 78 from the second terminal 102 of the inductor 74 at its non-inverting terminal, via the feedback stage 107. The transconductance amplifier may be implemented in accordance with the above-described advantageous techniques in accordance with the invention.

The output of the amplifier 105, which is a voltage-to-current transconductance amplifier, is connected to the inverting input of amplifier 113. The non-inverting input of amplifier 113 is connected to the battery 115, the other terminal of which is connected to electrical ground. The battery 115 represents a fixed voltage.

The output of the amplifier 113 is connected to the second terminal 102 of the inductor 74. The capacitor 109 and the resistor 111 are each connected, in parallel, between the input and output of the amplifier 113.

The correction amplifier arrangement 103 operates to compare the output supply voltage at the output of the inductor 74 with the envelope signal on line 76, which provides a reference, and generate an error signal which indicates an error in the output signal to thereby correct the signal. Thus the voltage signal on line 78 is the selected switched supply voltage corrected by the correction amplifier arrangement 103, and is delivered as the supply voltage for the RF amplifier 70.

The amplifier 105 may be implemented as a transconductance amplifier having control circuitry in accordance with the invention and embodiments as described herein.

An RF amplifier arrangement such as illustrated in FIG. 4, with an envelope tracking power supply, may be utilised in various applications, such as in transmitters of mobile communication handsets and mobile communication infrastructure devices.

The invention has been described herein with reference to particular advantageous embodiments and exemplary implementations. The invention is not limited to any details of any aspects of such embodiments and implementations. The scope of the invention is defined by the appended claims.

The invention claimed is:

1. An amplification stage comprising:
a current mirror circuit comprising a reference transistor arranged to receive a current associated with an input signal and an output transistor providing a current source for an output signal line;
an input transistor arranged to receive an input signal voltage at a control node thereof, and for providing a current sink to the output signal line;
circuitry arranged to maintain equality between the drain/collector voltages on the transistors of the current mirror circuit.

2. The amplification stage of claim 1, wherein the circuitry arranged to maintain equality between the drain/collector voltages on the transistors of the current mirror circuit includes an additional transistor having a conductive path connected between the current source and the output signal line, and being controlled by a difference between the drain/collector voltages.

3. The amplification stage of claim 2, further comprising a difference amplifier having inputs arranged to the drain/collector voltages of the current mirror circuit transistors, and an output connected to the control node of the additional transistor.

4. The amplification stage of claim 1, wherein the circuitry arranged to maintain equality between the drain/collector voltages on the transistors of the current mirror circuit includes an additional transistor having a conductive path connected between a supply voltage and the current source, and being controlled by a difference between the drain/collector voltages.

5. The amplification stage of claim 4, further comprising a difference amplifier having inputs arranged to the drain/collector voltages of the current mirror circuit transistors, and an output connected to the control node of the additional transistor.

6. The amplification stage of claim 1, comprising a further input transistor arranged to receive the input signal voltage at a control node thereof and for providing the current associated with the input signal.

7. A transconductance amplifier including an amplification stage according to claim 1.

8. An envelope tracking power supply for a radio frequency power amplifier including amplification stage according to claim 1.

9. A handset of a mobile communication system including an amplification stage according to claim 1.

10. An infrastructure element of a mobile communication system including an amplification stage according to claim 1.

11. An amplification stage comprising:
a current mirror circuit comprising a reference transistor arranged to receive a current associated with an input signal and an output transistor providing a current source for an output signal line;
a capacitor having one terminal connected to the drain/collector of the output transistor of the current mirror and one terminal connected to a supply voltage; and
circuitry arranged to maintain equality between the drain/collector voltages on the transistors of the current mirror circuit.

12. An amplification stage comprising:
a current mirror circuit comprising a reference transistor arranged to receive a reference current and an output transistor providing a current source for an output signal line;
a first input transistor arranged to receive an input signal, and provide the reference current to the reference transistor of the current mirror;
a second input transistor arranged to receive the input signal, and provide a current sink for the output signal line;
a difference amplifier arranged to amplify the difference between the drain/collector voltages of the reference and output transistors of the current mirror; and
an additional transistor connected in the current source path between a supply voltage and the output signal line, and arranged to receive the output of the difference amplifier at its control node, for maintaining equality between the drain/collector voltages on the transistors of the current mirror circuit.

13. The amplification stage of claim 12, wherein the additional transistor is connected between the supply voltage and source/emitter of the output transistor of the current mirror.

14. The amplification stage of claim 12, wherein the additional transistor is connected between the drain/collector of the output transistor of the current mirror and the output signal line.

15. The amplification stage of claim 12 further comprising a capacitor having one terminal connected to the drain/collector of the output transistor of the current mirror and one terminal connected to the first supply voltage.

16. The amplification stage of claim 12 further comprising an input stage for providing the input signal.

17. An envelope tracking power supply for an RF amplifier including a transconductance amplifier having an amplification stage according to claim 12.

18. A mobile communication system including an amplification stage according to claim 12.

* * * * *